United States Patent [19]

Uchikura

[11] Patent Number: 5,170,497
[45] Date of Patent: Dec. 8, 1992

[54] TUNING METHOD AND APPARATUS

[75] Inventor: Takao Uchikura, Saitama, Japan

[73] Assignee: Pioneer Electronic Corporation, Tokyo, Japan

[21] Appl. No.: 382,881

[22] Filed: Jul. 21, 1989

[30] Foreign Application Priority Data

Oct. 6, 1988 [JP] Japan .................................. 63-253272

[51] Int. Cl.[5] .............................................. H04B 1/16
[52] U.S. Cl. .............................. 455/183.2; 455/186.1
[58] Field of Search ............... 455/183, 182, 184, 185, 455/186, 183.2, 183.3, 192.1–192.3, 186.1; 358/191.1

[56] References Cited

U.S. PATENT DOCUMENTS 4,679,246 7/1987 Jeng ..................................... 455/186
4,723,302 2/1988 Fulmer et al. ....................... 455/186

Primary Examiner—Curtis Kuntz
Attorney, Agent, or Firm—Sughrue, Mion, Zinn Macpeak & Seas

[57] ABSTRACT

A frequency tuning method and apparatus for a broadcast receiver adapted to receive standard and offset broadcast channel frequencies. Each standard channel frequency is stored in a memory as representative data. Also stored are offset frequencies which are generated as a result of the receiver tuner searching for a channel and finding an offset channel. When a channel is selected, if there is an offset stored, the standard frequency plus the offset is applied to the tuning circuitry. If no offset is stored or if no signal is received strongly when the latter operation is performed, the tuner is tuned to the standard channel frequency. If no corresponding frequency is received strongly enough or if one is received but the system is not adequately tuned to it, the system alters its tuning frequency in discrete steps until it is tuned to a received channel frequency. The difference between the standard frequency and the tuned frequency is then stored as an offset frequency.

9 Claims, 3 Drawing Sheets

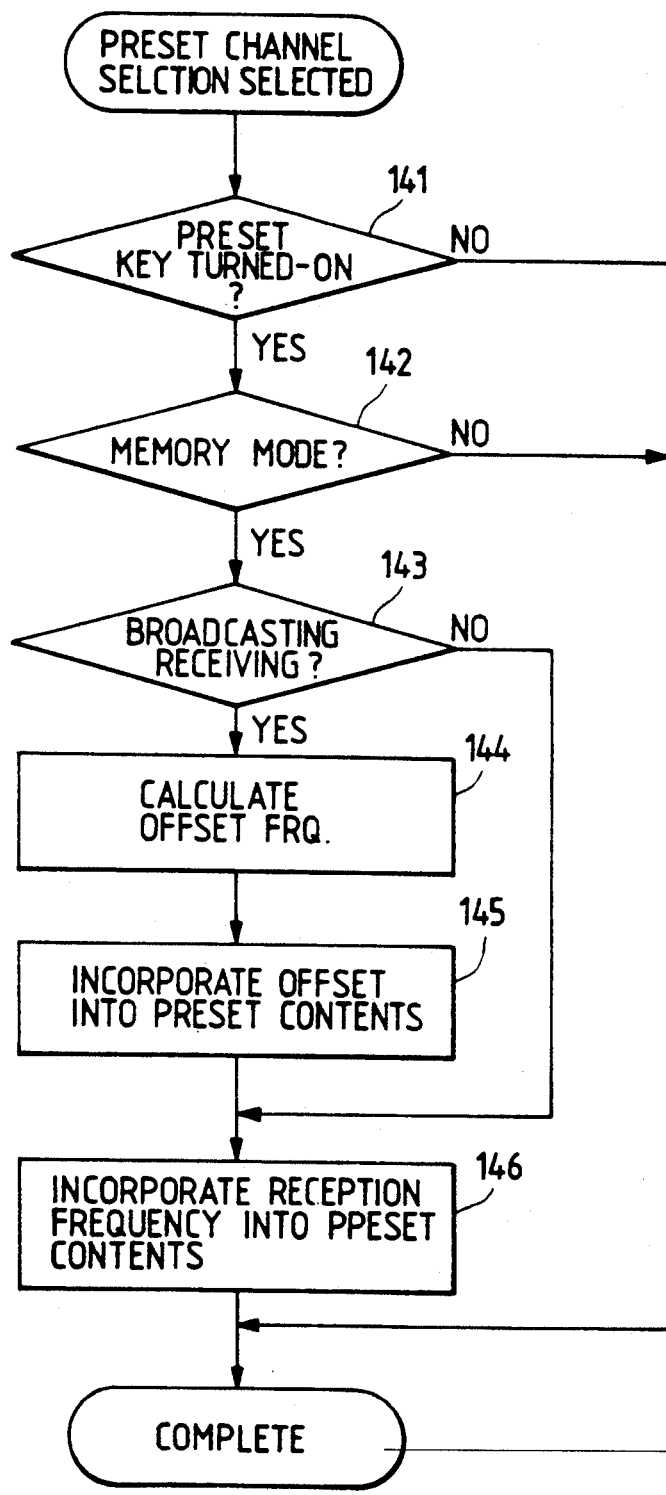

TUNING METHOD AND APPARATUS

BACKGROUND OF THE INVENTION

1. Field of the Invention

The present invention generally relates to a tuning method and apparatus, and particularly relates to a tuning apparatus such as a TV tuner or the like provided in a TV receiver for channel-selecting a specific TV broadcast station transmitting a signal with a predetermined specific frequency.

2. Description of the Prior Art

Conventionally, a broadcasting service such as TV broadcasting has been based on a channel plan (a frequency assignment plan) whereby an available carrier frequency is assigned in advance for every broadcast station so as to utilize effectively a predetermined frequency band. Therefore, when the operator of a TV receiver desires to receive the broadcast of a specific broadcast station, he selects the desired specific broadcasting station out of a multiplicity of such stations, generally 12 broadcast stations, by operating a channel switch which has been preset to frequencies assigned to specific broadcast stations, for example, to center frequencies assigned to specific broadcast stations, in accordance with the channel frequency assignments.

In the case of broadcasting, such as TV broadcasting or the like, two broadcast stations having channels of the same center frequency sometimes exist in neighboring locations. In such a case, there is a possibility of radio interference between the two broadcast stations. Such interference phenomenon has been heretofore prevented by shifting the carrier frequencies of the two broadcast stations so as to make the difference between the carrier frequencies equal to an odd number of half the horizontal scanning frequency (hereinafter, simply referred to as "offset").

This results in a broadcast station which broadcasts on a carrier frequency different from the center frequency determined on the basis of the channel plan, that is, it broadcasts on a carrier frequency which is "offset" from the center frequency of the channel plan.

Recent TV receivers include a frequency synthesizing system in which a PLL (phase locked loop) is used to perform tuning by generating, in a digital manner, a signal having a center frequency predetermined for every reception channel in accordance with the channel plan. Such systems provide very stable reception. In the case where reception/selection is made for a broadcast station that broadcasts an "offset" carrier frequency, it takes a long time for fine tuning when channel selection is automatically performed, for example, by using an AFT circuit in accordance with the center frequency. For example, as shown in FIG. 2, if the broadcast "offset" carrier frequency is $f_1$, but the center frequency is $f_0$, the receiver PLL gradually drives the reference frequency from $f_0$ to $f_1$ over a time $\Delta t$, which is equal to the difference between $t_0$ and $t_1$, where $t_0$ is the usual time for channel selection and $t_1$ is the time at which channel selection occurs in this case.

SUMMARY OF THE INVENTION

It is therefore an object of the present invention to eliminate the foregoing disadvantages in the prior art.

It is another object of the present invention to provide a tuning apparatus which shortens the channel selection time taken for performing channel selection in connection with the selection of a broadcast station having a carrier frequency "offset" from that designated by the channel plan.

In order to achieve the above objects, according to the present invention, the tuning apparatus comprises: a selection means for alternatively selecting a desired one of plural frequencies predetermined in advance; a difference detection means for detecting a difference between the predetermined frequency selected by the selection means and a reception frequency; a storage means for storing difference information related to the frequency difference detected by the difference detection means corresponding to the predetermined frequency; and a tuning means for performing a channel selection operation with respect to the predetermined frequency selected by the selection means on the basis of the difference information corresponding to the predetermined frequency stored in the storage means.

In the tuning apparatus according to the present invention, a desired frequency is alternatively selected by using the selection means so that the tuning operation for the predetermined frequency is performed by tuning means. That is, difference information obtained by detecting a difference between the predetermined frequency and a reception frequency by difference detection means is read out of the storage means so that the tuning operation is performed with reference to the difference information, for example, on the basis of the sum of the frequency obtained from the difference information and the predetermined frequency. Therefore, even in the case where the predetermined frequency is being outputted in the "offset" state, the tuning can be performed rapidly.

BRIEF DESCRIPTION OF THE DRAWINGS

FIG. 4 is a flowchart for explaining the preset processing procedure.

DETAILED DESCRIPTION OF THE PREFERRED EMBODIMENT

An embodiment of the present invention will be described in detail with reference to the accompanying drawings hereunder.

Figure 1:
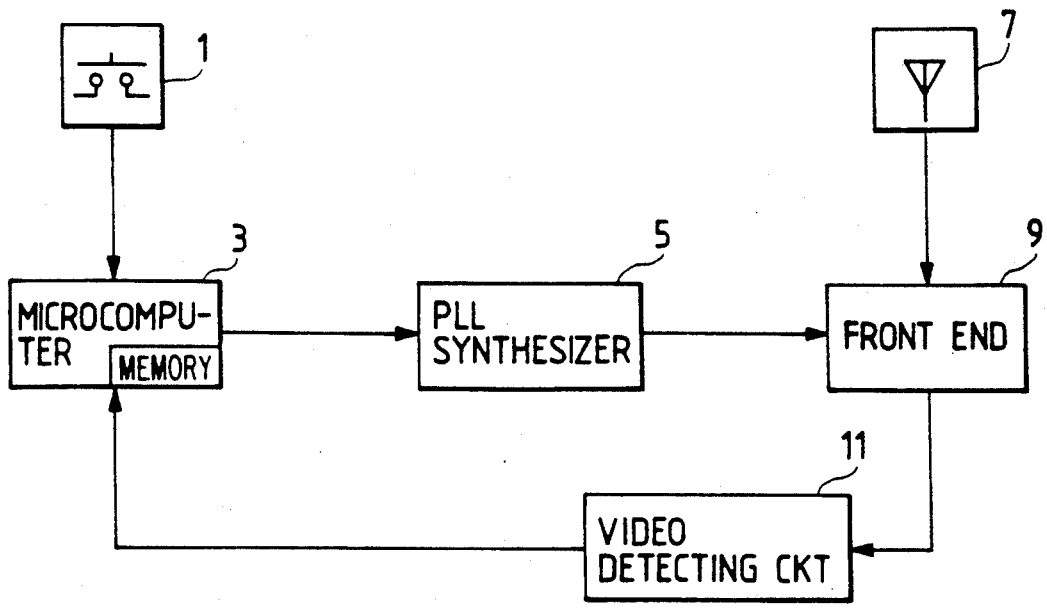
FIG. 1 is a block diagram showing an embodiment of the present invention.
Figure 2:
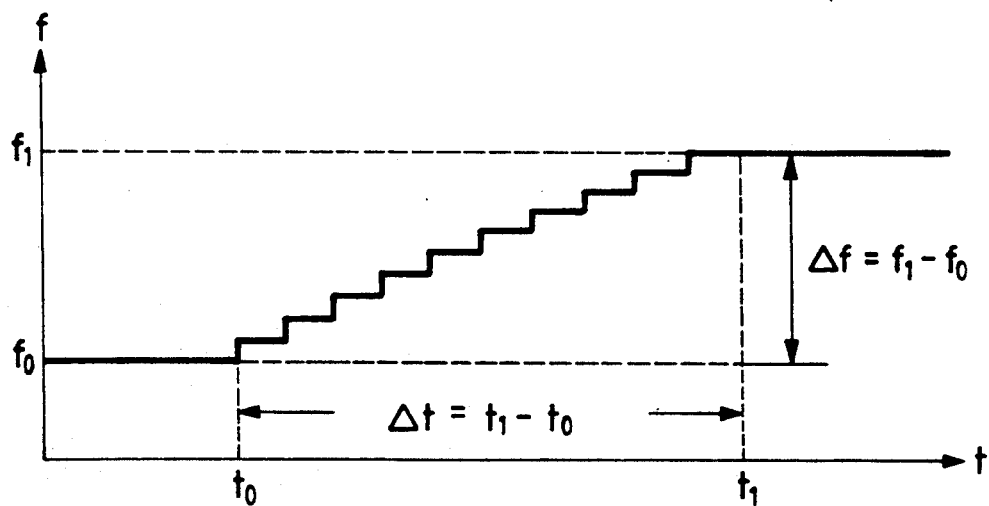
FIG. 2 is a diagram for explaining the operation of the embodiment of FIG. 1.

FIG. 1 is a block diagram showing the general configuration of an embodiment of the present invention.

A channel selecting switch 1 is generally constituted by 12 channel switches which correspond to channels for specific broadcast stations, respectively.

A channel selecting microcomputer 3 includes a storage portion (not shown) which stores frequency data corresponding to the center frequencies of the various channels. In response to an input from the channel selecting switch 1, the microcomputer 3 outputs frequency data, corresponding to the center frequency of the selected channel, to a PLL frequency synthesizer 5. Further, the microcomputer 3 calculates the difference between the selected center frequency and an input reception frequency applied thereto and stores the calculated difference frequency data in the storage portion thereof. Moreover, the microcomputer 3 reads the center frequency data corresponding to the selected channel and the previously stored difference frequency data and calculates the sum of those two data and supplies the sum to the PLL frequency synthesizer 5. At this time, if the difference between a newly input reception frequency and the center frequency is different from the preceding difference frequency data, the preceding difference frequency data is automatically renewed by the present difference frequency data.

Upon reception of the center frequency data from the microcomputer 3, the PLL frequency synthesizer 5 generates a tuning voltage for controlling a front end 9.

The front end 9 comprises an RF circuit, a local oscillator, a mixer, and the like. Upon reception of the tuning voltage from the PLL frequency synthesizer 5, the front end 9 selects a signal of a target frequency among radio frequency signals (hereinafter, referred to as "RF signals") supplied through an antenna 7.

A video detecting circuit 11 generates an AFT signal indicating a tuned state with the signal received and selected by the front end 9.

Next, referring to flowcharts of FIGS. 3 and 4, the operation of the embodiment of the present invention will be described on the basis of the channel selection procedure.

First, one of the channel switches of the channel selecting switch 1 corresponding to a desired broadcast station is turned on to start the tuning operation. Audio and video outputs are set to a muted condition in step 101 in response to the start of tuning. In step 102, it is determined whether tuning will be performed by a preset channel selection operation or by a non-preset channel selection operation. The determination is based upon the condition of certain manual switches. If a preset switch or one of the channel switches is operated, tuning is performed in accordance with preset channel selection. If a tuning switch is operated, tuning is performed in accordance with non-preset selection. If the latter, the operation is shifted to the step 111. If the former, the frequency data corresponding to the center frequency $f_0$ of the channel designated by the channel plan and selected by the operator is read out of the storage portion by the channel selecting microcomputer 3. In step 103 a judgment is made as to whether an "offset" value corresponding to the center frequency $f_0$ is stored in the storage portion or not. If yes, in step 104 the sum of the "offset" value $\Delta f$ and the center frequency $f_0$, that is. $(f_0+\Delta f)$. is calculated, and in step 105 the sum data is supplied to the PLL frequency synthesizer 5.

The PLL frequency synthesizer 5 generates a tuning voltage on the basis of the calculated data so as to control the front end 9. Then, in step 106 the system waits a predetermined time period for stabilizing the tuning voltage. After the tuning voltage has been stabilized, the frequency corresponding to the tuning voltage, that is, the frequency $f_1$ ($=f_0+\Delta f$) of the signal being transmitted by the target broadcast station, is selected among the RF signals supplied through the antenna 7.

In step 107 it is determined whether or not a broadcast channel has been received by the preset channel selection operation. If the received signal at frequency $f_1$ is sufficient, it is determined that the selected channel has been received. Otherwise it is determined that the selected channel has not been received.

If the channel selected cannot be received through "offset" correction in the steps 103 through 105, then the operation is shifted to the step 111. On the other hand, if the selected broadcast channel is received, the operation is shifted to the step 108. Step 108 releases the muted condition to end the channel selection process in the case where the selected broadcast channel is being received by means of the tuning carried out in steps 103-107.

In the case where a tuning switch has been manually selected (step 102). or no offset is stored for a selected channel (step 103), or tuning is not effective in steps 103-107, the operation proceeds with step 111. In step 111 the frequency data corresponding to the center frequency $f_0$ designated by the channel plan is read out of the storage portion. The read out frequency data is supplied to the PLL frequency synthesizer 5 in the step 112, and in step 113 the operation waits until the tuning voltage corresponding to the frequency data is stabilized.

In the case where no broadcast station corresponding to the tuning voltage is received through the operation of steps 111-113, in the step 114 the operation is shifted to the step 121. This judgment is performed the same as in step 107. If the broadcast station corresponding to the tuning voltage is received, the operation is shifted to the step 115 in which the tuned state is checked with respect to the received RF signal by monitoring the difference between the desired specific frequency and the receiving frequency by the AFT detector of the video detecting circuit. If the difference is substantially zero, it is judged that the frequency is tuned. If not tuned, the operation is shifted to the step 131, while if in the tuned state, the operation is shifted to the step 116. In step 116 a judgment is made as to whether the channel selection for the tuned broadcast station is to be performed by preset channel selection or not. Judgment is made in step 116 in the same manner as in step 102, i.e., it is based on whether the preset or channel switches are set or whether the tuning switch is set. If preset channel selection is desired and selected, the operation is shifted to step 117 in which an amount of "offset" of the output frequency of the broadcast station is stored in the storage portion, and thereafter, the operation is shifted to the step 108 in which the muted state is released to end the channel selection. In the case where preset channel selection is not selected, as determined in step 116, the offset storage step 117 is skipped, and muting is released directly.

Referring back to step 114, if no broadcast station is received it is determined in step 121 whether or not the operation is the first routine following initiation of channel selection. If it is the first routing, 2.5 MHz is subtracted in step 122 from the center frequency of the selected channel and the routing is then returned to step 112.

Thereafter, the operation proceeds once again according to steps 112 through 114 as before, except that the PLL 5 tunes the system to the frequency $f_0 - 2.5$ MHz. If a broadcast channel is still not received, step 121 indicates this is not the first routine, and step 123 increases the frequency by 250 kHz to $f_0-2.5$ MHz+250 kHz. The operation is then shifted to the step 124 in which a judgment is made as to whether the present channel selection frequency is smaller than the total frequency of the center frequency of the channel plan and +2.5 MHz or not. If yes, the operation is returned to the step 112. If no, on the contrary, the operation is returned to the step 122. Thus, tuning proceeds first at $f_0-2.5$ MHz, then in successive steps at which the tuning frequency is increased by 250 MHz until the tuning frequency reaches $f_0+2.5$ MHz. In this way the tuning operation covers a range of $f_0\pm2.5$ MHz. As described, when no broadcast station is received, the tuning operation is repeated from the step 111 to the step 124 until the broadcast can be received.

Returning now to step 115, if it has been determined in step 114 that a corresponding broadcast channel has been received, but according to step 115, the system is not properly frequency tuned, the operation is shifted to the step 131 in which the present channel selection frequency is compared with the input frequency.

If judgment proves that the present channel selection frequency is higher than the input frequency, the present channel selection frequency is decreased by 50 KHz in step 132. If judgment proves that the present channel selection frequency is lower than the input frequency, on the contrary, the present channel selection frequency is increased by 50 KHz in the step 134. Then, judgment is made as to whether the channel selection frequency after adjustment in the step 132 or 134 exists within a range of the center frequency of the channel plan ±2.5 MHz or not in the step 133. If yes, the operation is returned to the step 112. If no, on the contrary, the operation is shifted to the step 122.

Figure 3:
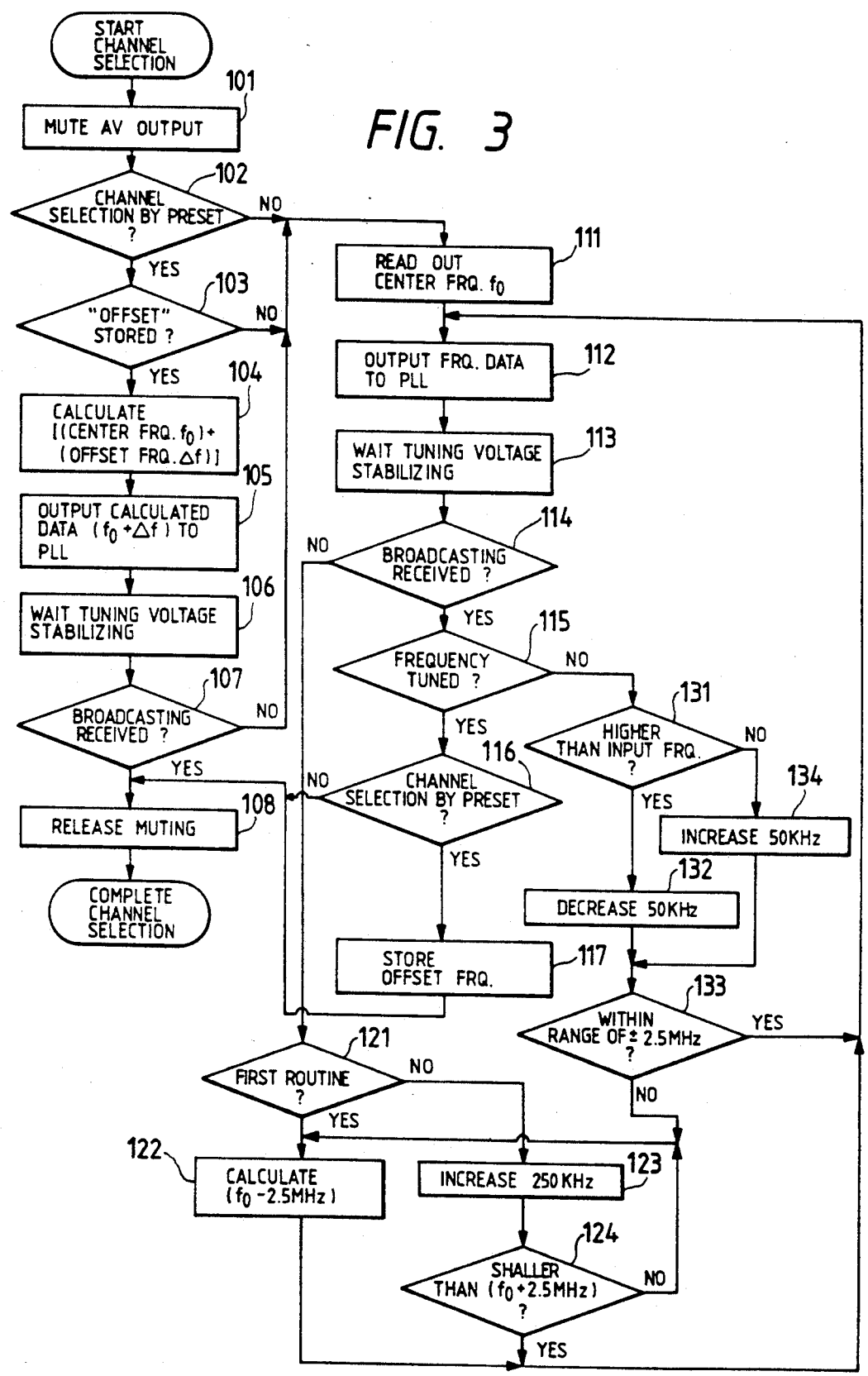
FIG. 3 is a flow chart for explaining the channel selection procedure.

It will be appreciated that the procedure according to FIG. 3 provides coarse tuning and fine tuning, thereby speeding up the tuning procedure. When a broadcast channel is frequency offset from a channel plan frequency $f_0$, it is usually offset between 1-2 MHz. In steps 122-124, in conjunction with step 114, the system is coarsely tuned by step increments of 250 kHz, while looking for the broadcast channel. When located, the system is then fine tuned in increments of 50 kHz by steps 131-134 in conjunction with step 115.

Next, referring to FIG. 4, a preset processing procedure for presetting the desired broadcasting stations to the desired preset number will be described.

First, preset channel selection is selected. Next, in step 141 it is determined whether the preset key is turned on. If yes, judgment is made in step 142 whether channel selection is to be performed in accordance with a memory mode or not. And in step 143 judgment is made as to whether broadcasting is being received.

If broadcasting is being received, the amount of "offset" of the reception frequency is calculated in step 144, and the "offset" amount is incorporated into preset contents in step 145, and then the operation is shifted to step 146.

In step 146, the value of the reception frequency of the channel is incorporated into the preset contents, similarly to the case where broadcast is not being received to end the preset processing.

Thus, in this embodiment, channel selection can be performed under the condition that the frequency $f_1$ transmitted by a broadcast station can be always apparently regarded as the center frequency $f_1$ designated by the channel plan, and therefore the time taken for tuning can be made equal, in any case, to the tuning time taken for the tuning in channel selection for a broadcast station transmitting an output with a frequency designated by the channel plan.

Further, if the actual frequency being transmitted by a broadcast station is different from the channel selection frequency, it is possible to easily rapidly obtain a new channel selection frequency by discriminating the AFT signal generated by the video detecting circuit 11 to thereby calculate a new difference frequency. Furthermore, the tuning method according to the present invention is preferable for use in the TV receiver mounted on the vehicle or the like.

Although description has been made in connection with a TV broadcast system, the present invention is not limited to TV broadcasting, and can apply to any kind of preset channel selection in which an "offset" exists.

As described above, according to the present invention, since a channel selection operation is performed with an offset frequency even in the case of receiving a broadcast station transmitting a frequency which is "offset" from a center frequency designated by the channel plan, the channel selection can be performed at a speed equal to that for broadcasting with the frequency in accordance with the channel plan.

What is claimed is:

1. A channel selection apparatus comprising:
    a selection means for alternatively selecting a desired one of plural frequencies set in advance;
    a difference detection means connected to said selection means for detecting a difference between said desired set frequency selected by said selection means and a reception frequency;
    a storage means for storing difference information related to said frequency difference detected by said difference detection means directly corresponding to said desired set frequency in a one-to-one correspondence; and
    a channel selection means for performing a channel selection operation with respect to said desired set frequency selected by said selection means on the basis of said difference information directly corresponding to said desired set frequency stored in said storage means.

2. A method for tuning a radio frequency receiver to receive selected broadcast channels, said receiver having storage means for storing data representing the frequency $f_0$ of a broadcast channel and data representing offset frequency $\Delta f$ directly related to $f_0$ in a one-to-one correspondence, and a turing circuit responsive to frequency related data read from said memory and applied thereto for tuning the receiver to receive a broadcast channel having a center frequency corresponding to said data, and detector means for detecting the center frequency of received radio frequency signals, the method comprising:
    selecting a desired channel for reception;
    reading the frequency data from said storage means corresponding to the stored frequency $f_0$ and the offset frequency $\Delta f$ for said selected channel;
    applying the sum of the stored frequency $f_0$ and the offset frequency $\Delta f$ to said tuning circuit to tune the receiver to a corresponding tuned frequency; and
    detecting the presence of a received broadcast channel at a frequency corresponding to said tuned frequency.

3. A method as claimed in claim 2, further comprising the steps of:
    switching to a step of reading from said storage means only data corresponding to the center frequency $f_0$ of the selected channel, if any of the following conditions occur:
    (a) the operator chooses this path;
    (b) no offset is stored for the selected channel, or
    (c) no corresponding broadcast signal is detected as a result of the steps of claim 2;
    applying the read-out data corresponding to the center frequency $f_0$ of the selected channel to said tuning circuit; and detecting the presence of a received broadcast channel at a frequency corresponding to said tuned frequency.

4. A method as claimed in claim 3, further comprising the steps of:

if a broadcast frequency corresponding to the frequency to which the receiver is tuned is detected, further determining if the received broadcast channel is substantially the same as the tuned frequency:

if not, adjusting the tuning frequency of the tuning circuit in discrete first increments until the center frequency of the received broadcast channel is substantially the same as that of the tuning frequency of the tuning circuit.

5. A method as claimed in claim 4, further comprising:

storing in said storage means data corresponding a new offset frequency for said selected channel if said receiver is tuned to the center frequency of said received broadcast channel; the new offset frequency being the difference between the frequency $f_0$ of the selected channel and the actual tuning circuit frequency obtained by the above tuning steps.

6. A method as claimed in claim 5, further comprising:

if the detecting step of claim 3 does not result in reception of a broadcast channel having a center frequency corresponding to the data read from storage in claim 3, altering the tuning frequency of said tuning circuit by a relatively large second increment and continuing to detect if a broadcast channel is received having a center frequency corresponding to said current tuned frequency;

further incrementing the tuned frequency of said tuning circuit in third incremental steps and continuing to detect if a broadcast channel is received having a center frequency corresponding to said current tuned frequency.

7. A method as claimed in claim 6, wherein said first increments are +50 kHz increments, said second increment is −2.5 MHz, and said third incremental steps are +250 kHz.

8. A channel selection apparatus for selecting a desired channel from a plurality of channels, said apparatus comprising:

selector means for allowing for the manual selection of one of said plurality of channels;

control means for receiving an output from said selector means and for generating frequency-related data based on said received output from said selector means;

tuning selector means for receiving said frequency-related data and for selecting a signal of a target frequency among RF signals supplied through an antenna based on said received frequency-related data;

detection means for detecting whether said signal of a target frequency output from said tuning selector means corresponds to the channel selected by said selector means and for outputting a status signal to said control means for indicating to said control means whether said signal of a target frequency output from said tuning selector means corresponds to the channel selected by said selector means, wherein said control means further comprises step means for altering said frequency-related data in a step-wise fashion in response to said status signal until said status signal indicates that said signal of a target frequency output form said tuning selector means corresponds to the channel selected by said selector means;

said control means further comprising subtraction means for subtracting a signal corresponding to the channel selected by said selection means from a signal corresponding to said signal of a target frequency;

said control means still further comprising storage means for storing an output of said subtraction means in a one-to-one correspondence with each of said plurality of channels;

said control means still further comprising addition means for adding a signal corresponding to the channel selected by said selector means to the corresponding stored output of said subtraction means, and for supplying an output to said tuning selector means as said frequency-related data.

9. A channel selection apparatus comprising:

a selection means for alternatively selecting a desired one of plural frequencies set in advance;

a storage means for storing difference information related to a frequency difference between said desired set frequency selected by said selection means and a frequency offset from said desired set frequency in a one-to-one correspondence; and a channel selection means for performing a channel selection operation with respect to said desired set frequency selected by said selection means on the basis of said difference information directly corresponding to said desired set frequency stored in said storage means.

* * * * *